(12) United States Patent
Blasi et al.

(10) Patent No.: US 7,190,631 B2
(45) Date of Patent: Mar. 13, 2007

(54) MULTI-PORT MEMORY

(75) Inventors: Gianluca Blasi, Vimercate (IT);
Barbara Vese, Milano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/228,686

(22) Filed: Sep. 16, 2005

(65) Prior Publication Data

US 2006/0062057 A1    Mar. 23, 2006

(30) Foreign Application Priority Data

Sep. 17, 2004   (EP) ................................ 04425692

(51) Int. Cl.
*G11C 8/00* (2006.01)

(52) U.S. Cl. ............. 365/230.05; 365/193; 365/189.12

(58) Field of Classification Search ........... 365/230.05, 365/193, 189.12
See application file for complete search history.

(56) References Cited

U.S. PATENT DOCUMENTS

| | | | |
|---|---|---|---|
| 5,422,858 A | 6/1995 | Mizukami et al. | 365/233 |
| 6,317,367 B1 | 11/2001 | Sample et al. | 365/189 |
| 7,035,985 B2 * | 4/2006 | Bachot et al. | 365/230.05 |
| 2004/0107307 A1 | 6/2004 | Hasegawa et al. | 711/1 |

* cited by examiner

*Primary Examiner*—Huan Hoang
(74) *Attorney, Agent, or Firm*—Lisa K. Jorgenson; Allen, Dyer, Doppelt, Milbrath & Gilchrist, P.A.

(57) ABSTRACT

The semi-conductor memory includes a memory device to store digital data being provided with a first number of intermediate output ports including a first intermediate output port. Furthermore, the memory includes a register block that can be selectively connected to the first intermediate output port to store data in the memory device and a second number of output ports including first and second output ports. The memory includes an interface device to receive strobe signals from the memory device, each being indicative of the presence of data on the at least one intermediate output port. This interface device, based on the strobe signals, controls the register block to provide the data stored in the register on the first and second output ports, by emulating a multi-port memory where the second number is greater than the first number.

25 Claims, 7 Drawing Sheets

400a

MULTI-PORT MEMORY

FIELD OF THE INVENTION

The present invention relates to the field of semiconductor memories, and more particularly to multi-port memories.

BACKGROUND OF THE INVENTION

The multi-port memories are used in a number of technological fields, mainly in the field of communication systems and multi-processor systems. Particularly, these memories are used with switching operations for telecommunications, that is, with information transmission systems through data packs, for example in accordance with the "Ethernet" protocol.

As is known by those skilled in the art, at a digital clock signal pulse, through each port of a multi-port memory, one can access a different location of the memory for reading. Furthermore, the multi-port memories are symmetric memories, i.e. by writing strings of N bits to memory, one can read N bits from each port. For example, if a four-bit data bus is the input of a dual-port memory, from these ports one can read two distinct four-bit memory locations per each clock pulse.

To be able to read more than two memory locations at a time, i.e. to be able to have a greater number of ports, the four-bit data bus also requires to be written in parallel to additional memories that are similar to the previous one. For example, to have a multi-port memory with eight ports, the input data bus requires to be provided in parallel to three additional dual-port memories. The contents of the start memory will be thereby replicated to these additional memories.

With this technical approach, one can randomly access a number of various information, such as the data relative to different audio channels. However, upon increase in the N number of information bits to be written to the memory and read from each port, the above approach needs an excessive occupation of the chip area, as well as an excessive routing of signals. For considerable amounts of bits to be stored, in fact, multi-port memories are provided via elementary memory blocks each having a maximum number of ports. Consequently, one can increase the number of ports of these memories only by replicating the structures of all the above elementary multi-port memories for several times. This increases both the area occupied by the chip and the cost thereof. Furthermore, because of the symmetry of the memory, much more bits than strictly required are read from each port (for example, 1024 bits instead of 16 bits of an audio channel), i.e. a routing of redundant signals is generated that further deteriorates the sturdiness of the chip.

SUMMARY OF THE INVENTION

In view of the foregoing background, it is therefore an object of the present invention to provide an improved semiconductor memory compared to traditional multi-port memories.

This and other objects, features, and advantages in accordance with the present invention are achieved by a memory including a memory device to store digital data being provided with a first number of intermediate output ports including a first intermediate output port. Furthermore, the memory includes a register block that can be selectively connected to the first intermediate output port to store data in the memory device and a second number of output ports including first and second output ports. The memory includes an interface device to receive strobe signals from the memory device, each being indicative of the presence of data on the at least one intermediate output port. This interface device, based on the strobe signals, controls the register block to provide the data stored in the register on the first and second output ports, by emulating a multi-port memory where the second number is greater than the first number.

BRIEF DESCRIPTION OF THE DRAWINGS

The characteristics and the advantages of the present invention will be understood from the following detailed description of an embodiment thereof, which is given as a non-limiting example, with reference to the annexed drawings, in which.

DETAILED DESCRIPTION OF THE PREFERRED EMBODIMENTS

Figure 1:
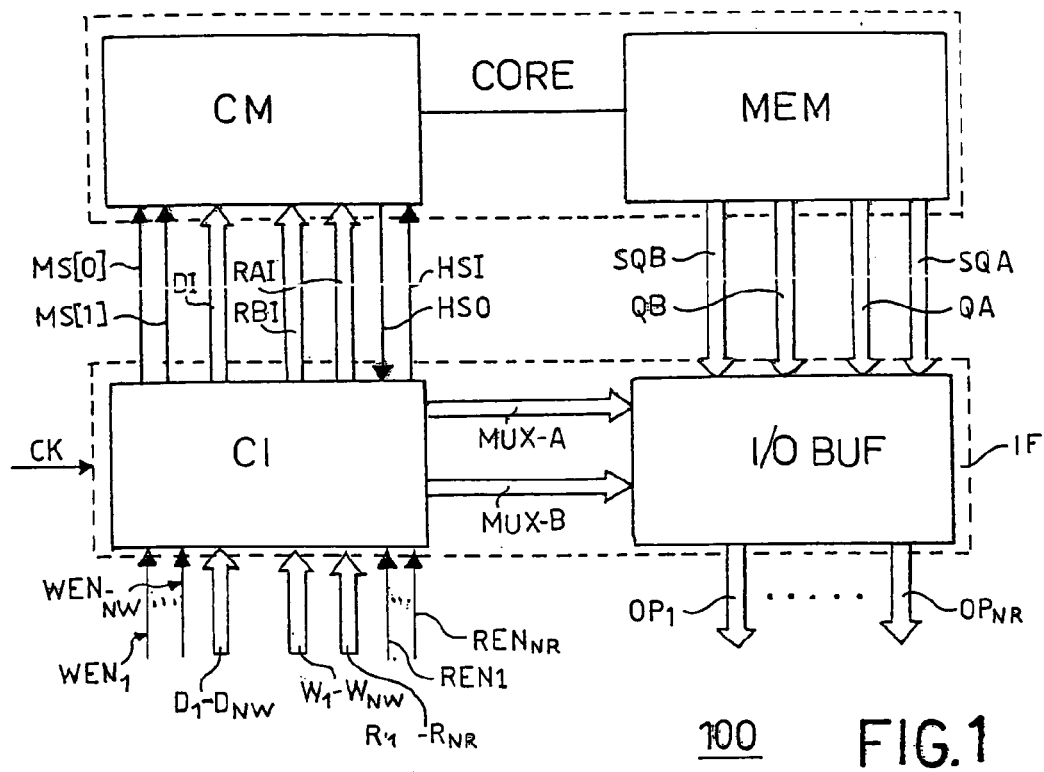
FIG. 1 is a block diagram illustrating a memory in accordance with the invention, wherein the information exchanged between a memory device and an interface device are described.

A semiconductor memory 100 in accordance with the present invention is depicted in FIG. 1 via a block diagram. This memory 100 comprises a memory device CORE and an interface device IF that are capable of exchanging a plurality of data and digital information with each other. In greater detail, the memory device CORE comprises a data storage block MEM that, as is known to those skilled in the art, includes, besides a true memory array, sense amplifiers, line and column decoders, as well as input and output buffers. For clarity reasons, the storage block will be hereinafter called memory array MEM.

In the following, it will be assumed that the memory device CORE is a dual-port device (indicated with the letters A and B) comprising a memory array MEM, for example, of the SRAM type. In other words, for this device CORE one can execute two simultaneous read operations or a write operation at each elementary operation, i.e. each access to memory array MEM. Even though reference will be made, by way of example, to a dual-port memory device CORE, the present invention can also apply to the case where the memory device CORE is a one-port type or has more than two ports.

Furthermore, the memory device CORE (for example, of the conventional type) comprises a first control block CM of the memory array MEM to enable write/read operations to/from the same memory array MEM. Consequently to receive an external system clock pulse CK, the interface device IF of the invention is configured such as to train the memory device CORE for several times, i.e. to access for several times the device CORE in the time domain multiplexing (TDM) to read/write from/to the memory array MEM. For example, starting from an external clock CK at about 156 MHz frequency, one can train the memory device CORE at a five-fold higher frequency, i.e. about 800 MHz. The memory 100 of the invention is thereby faster than the clock CK and is capable of externally emulating a greater number of ports than those expected with memory device CORE.

The interface device IF comprises input and output buffer blocks I/O BUF to receive a first QA and a second QB intermediate digital data through homonymous data buses. These intermediate data QA and QB are the contents of two distinct locations of array MEM that are read through both ports of the same memory array MEM at each elementary read access to the memory device CORE. As is known by those skilled in the art, with the word "data bus" is meant a plurality of conductive lines each one executing a one-bit only indicative signal.

Furthermore, first SQA and second SQB validation signals (strobe signals) being generated within the array MEM are provided to the buffer block I/O BUF via corresponding signal buses. Advantageously, the strobe signals SQA and SQB are indicative of the presence (for example, logical values 1) or absence (for example, logical values 0) of the first QA and second QB intermediate data on the ports of memory array MEM, respectively. Furthermore, the buffer block I/O BUF comprises a number NR of output buses $OP_1-OP_{NR}$ to simultaneously output the intermediate data QA and QB that are read at several elementary accesses to the memory device CORE and temporarily stored in the buffer block I/O BUF.

It should be observed that the output buses $OP_1-OP_{NR}$ are read ports emulated by memory 100 and, advantageously, their number NR is greater than the number (equal to two, according to the example described) of buses of intermediate data QA and QB being outputted from the memory device CORE. Therefore, memory 100 can emulate a multi-port memory with a number NR of read output buses that is greater than the number of read data buses with which the memory array employed is provided. Advantageously, each output bus $OP_1-OP_{NR}$ comprises conductive lines (each one being dedicated to a bit) the number of which can be less than the number of bits (i.e. conductive lines) of the bus of first QA and second QB intermediate data.

The interface device IF comprises a second control block CI that will be hereinafter referred to as the control block CI. The control block CI operates by exchanging a first HSI and a second HSO handshake signals with the first control block CM of the memory device CORE. Both first HSI and second HSO handshake signals can be asserted/deasserted between two logical levels.

Particularly, the first handshake signal HSI (handshake in) is generated by the control block CI to be sent to the first block CM. This first signal HSI (for example, when it is asserted) is indicative of the beginning of an elementary access to the memory array MEM, i.e. the beginning of a read/write data operation from/to memory array MEM. On the contrary, the second handshake signal HSO (handshake out) is generated by the first control block CM to be sent to the control block CI. This second signal HSO, when asserted, is indicative of the end of an elementary read/write data operation from/to the memory array MEM.

It should be noted that the strobe signals SQA and SQB, as well as the second handshake signal HSO are normally present in a conventional memory device CORE, but they are not made distinguishable from the outside. It should be observed that, during read/write operations, the number of assertions of the handshake signals HSI and HSO equals the number of elementary accesses to the memory device CORE that are carried out between two subsequent pulses of the digital clock signal CK. Advantageously, the handshake signals HSI and HSO, allow managing the accesses to the memory device CORE by the interface device IF in an asynchronous manner, i.e. independently from system clock signal CK. In other words, a new access to the device CORE will be started (with the signal HSI being asserted) only after the latter communicates (with the signal HSO asserted) that the previous access is terminated. It should be noted that the memory 100 continues to appear externally as being synchronous in accordance to the clock signal CK.

Furthermore, the control block CI is such to receive from the outside a plurality of NW input data buses $D_1-D_{NW}$ (outlined in FIG. 1 with one single arrow-bus) to be written in the array MEM. These input data buses $D_1-D_{NW}$ are write ports being emulated by memory 100. These input data $D_1-D_{NW}$ are provided to the memory device CORE via a respective further intermediate input data bus DI. The intermediate input data bus DI is an input data bus for the memory device CORE.

For example, the total number of conductive lines (each one being dedicated to one bit) of the data buses $D_1-D_{NW}$ is the same as the conductive lines of the intermediate input data bus DI. Furthermore, the number of conductive lines of the intermediate input data bus DI is the same as the conductive lines of the intermediate output data bus QA (QB). It should be observed that the total number of input/output data ports being externally emulated by memory 100 is NR+NW, where NR and NW may be different.

Furthermore, the control block CI is configured to receive first write enable digital signals $WEN_1-WEN_{NW}$ (bit 0 or 1) and second read enable digital signals $REN_1-REN_{NR}$ from the outside of memory 100. The number of these read/write enable signals $WEN_1-WEN_{NW}$ and $REN_1-REN_{NR}$ is the same as NW and NR, respectively, such as to read/write enable/disable the memory 100 as emulated. Consequent to receiving these first $WEN_1-WEN_{NW}$ and second $REN_1-REN_{NR}$ signals, the control block CI provides the memory device CORE with a first MS[0] and a second MS[1] mode select binary signals, each being present on a respective conductive line. For example, the first mode signal MS[0] and the second mode signal MS[1] read/write enable/disable the memory device CORE according to the Table 1 below:

TABLE 1

| MS[0] | MS[1] | OPERATION |
|---|---|---|
| 0 | 0 | Read enable by means of the intermediate data buses QA and QB |
| 0 | 1 | Read enable by means of the intermediate data bus QB |
| 1 | 0 | Read enable by means of the intermediate data bus QA |
| 1 | 1 | Write enable by means of the bus DI |

The control block CI is such to receive first location addresses $W_1-W_{NW}$ of array MEM to be written by the NW write ports and second addresses $R_1-R_{NR}$ of locations to be read by the NR read ports. Particularly, these addresses are provided to the control block CI by means of NW homonymous write-dedicated address buses and NR homonymous read-dedicated address buses. For example, a bus for a plurality of respective bits is associated to the address W1 (R1). The set of address buses $W_1$–$W_{NW}$ ($R_1$–$R_{NR}$) is depicted in FIG. 1, for clarity reasons, with one arrow only.

Each of the buses of the address bus group $R_1$–$R_{NR}$, for example the generic address bus Rj, comprises a first group of bits (for example, the most significant ones) that are representative of the line address of the memory array MEM where there is the location to be read. The remainder bits of the address Rj (for example, the less significant ones) are a second group of bits that are indicative of the particular subset of the conductive lines of QA and QB which is desired to be read on the output buses $OP_1$–$OP_{NR}$.

While reading, as will be better understood below, the control block CI based on the first group of bits of each address $R_1$–$R_{NR}$ generates further address signals provided on a first line address bus RAI and a second line address bus RBI to be sent to the memory device CORE that will employ them to read corresponding locations of the memory array MEM. The first address bus RAI is referred to the first intermediate data bus QA and the second address bus RBI is referred to the second intermediate data bus QB. Furthermore, while reading, as will be better understood below, the control block CI based on the second group of bits of each address $R_1$–$R_{NR}$ generates first MUX_A and second MUX_B multiplexing digital signal to be sent to the buffer block I/O BUF, which will employ them to suitably send the data read on the output buses $OP_1$–$OP_{NR}$.

During a write operation, the address signals being provided on the first line address bus RAI and second line address bus RBI are obtained from the control block CI, based on the information content of the first addresses $W_1$–$W_{NW}$. In this case, the first line addresses RAI and the second line addresses RBI are the addresses of the locations of the memory array MEM to be written.

Figure 2:
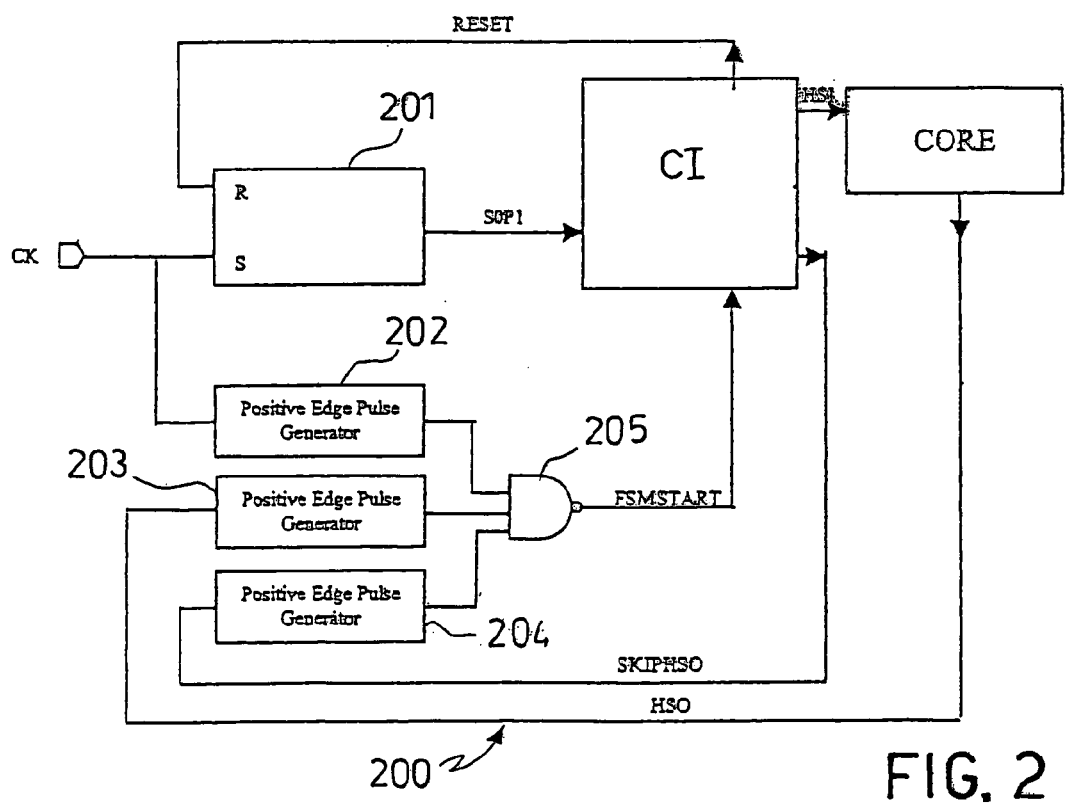
FIG. 2 is a schematic diagram illustrating the memory device and several blocks included in the interface device of FIG. 1.

A detailed structure of the interface device IF of FIG. 1 is illustrated in FIG. 2. Particularly, this FIG. 2 illustrates a sub-block 200, included in the interface device IF, and the memory device CORE. The sub-block 200 comprises, in addition to control block CI, a digital electronic device, for example of the latch 201 type having a first input S (set input) to be activated by the clock signal CK external to memory 100, i.e. by a system clock pulse. One output of latch 201 is connected to the control block CI to sent to the last one an input storage signal S0P1 at a rising edge of the clock pulse CK. A second input R (reset) of the latch 201 can be commanded by the control block CI after the accesses to the memory array MEM are terminated.

Furthermore, the sub-block 200 of the interface device IF comprises a first 202, a second 203 and a third 204 positive edge pulse generators, each of them being output connected to a first logical NAND gate 205 having three inputs. The clock signal CK is the input signal of the first generator 202, whereas the second handshake signal HSO being generated by the memory device CORE is the input signal of the second generator 203.

It should be observed that the interface device IF of the invention provides a first skip signal SKIP inhibiting the execution of an elementary operation, i.e. to skip one or more accesses to the memory array MEM. This first signal SKIP is not explicitly shown in FIG. 2 and will be better detailed below. In addition, the interface device IF provides a second skip signal SKIPHSO to terminate an inhibition step of an elementary access. Particularly, with reference to FIG. 2, the third generator 204 can be controlled by the control block CI by means of said second skip signal SKIPHSO. The NAND gate 205 is connected to the control block CI to send a start signal FSMSTART to it and enable the access to the memory array MEM.

Figure 3:
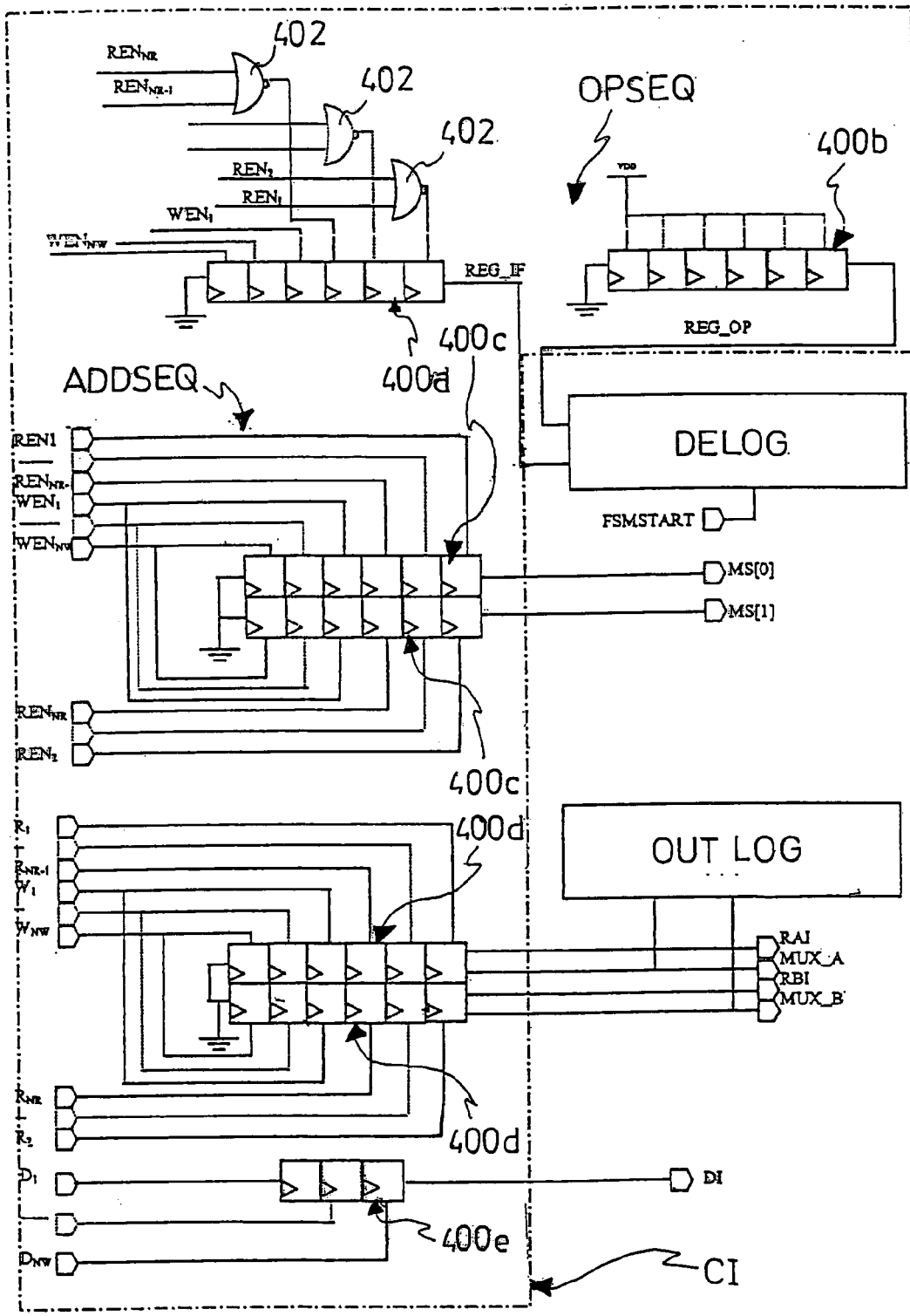
FIG. 3 is a schematic diagram illustrating a preferred embodiment of an inner structure of a control block of the interface device of FIG. 1.
Figure 4:
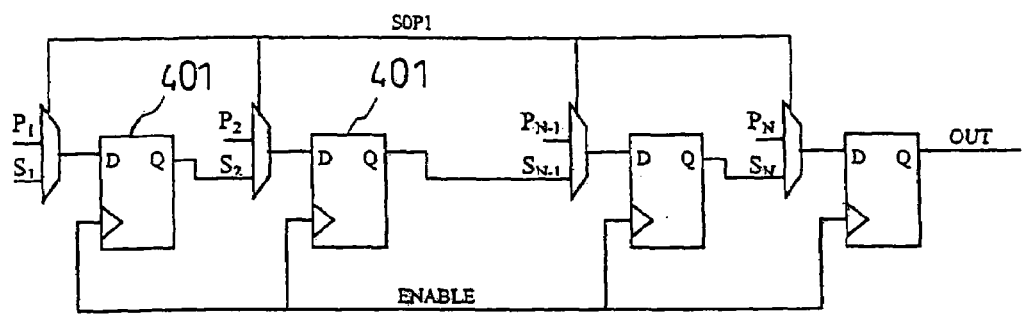
FIG. 4 is a schematic diagram illustrating an example of a register of digital devices to be used in the control block of FIG. 3.

A preferred embodiment of the inner structure of the control block CI of the interface device IF is depicted in FIG. 3. Particularly, it can be seen in the figure that the control block CI comprises a first digital register 400a, a second digital register 400b, further first digital registers 400c, further second digital registers 400d and a third digital register 400e. These digital registers 400a–e are provided by logical devices of the same type and connected in cascade. For example, the digital registers 400b–e can be analogous to each other and similar to register 400a that is shown in FIG. 4 and, therefore, only the first register 400a will be described According to the example from FIG. 4, the first register 400a comprises a chain of N flip-flops 401 of type D that are cascade connected to each other. Each register 400a–e is a static sequential circuit in which the outputs are a function of the current inputs and also the values of the preceding inputs. Moreover, one of the two further registers 400d can comprise a plurality of registers (each being analogous to the register from FIG. 4) having a respective output flip-flop connected to a corresponding conductive line of the line address bus RAI and the bus relative to the first multiplexing digital signals MUX_A. Similar considerations are valid for the other register 400d being connected to the buses RBI and MUX_B.

Each flip-flop 401 of the first register 400a from FIG. 4 is provided with a parallel input Pi and a serial input $S_i$ (i being variable from 1 to N) that can be selected by means of the input storage signal S0P1. As is known to those skilled in the art, the single flip-flop 401 comprises two cascade stages: a master and a slave. The serial input $S_i$ is directly connected to the master stage input, whereas the parallel input $P_i$ is connected to the slave stage input. Furthermore, each flip-flop 401 (except for the last one) is output connected to the serial input of the flip-flop coming next in the chain. An output OUT of the last flip-flop of register 400a corresponds to a serial output of the register. Advantageously, all flip-flops 401 are controlled by the same enable signal ENABLE being provided, for example, via a sequence of clock pulses.

It should be observed that the data stored in register 400a via the parallel outputs can be serially transferred to the output OUT at each ENABLE pulse. It should be observed that the serial input of the first flip-flop of the registers 400a–d of the control block CI are mass connected.

An operation sequencer OPSEQ of the control block CI from FIG. 3 comprises the first 400a and second 400b registers to provide (through the respective serial outputs) a first REG_IF and a second REG_OP current status flags to a decision logic block DELOG. The first flag REG_IF is a bit indicating whether an elementary operation (read or write) has been carried out or not. The second flag REG_OP is a count bit for elementary operations, i.e. it allows to evaluate whether an elementary operation is the last operation of a cycle of accesses to the memory device CORE.

The first register 400a is configured to store, through its parallel inputs, the first write enable digital signals $WEN_1$–$WEN_{NW}$ and further digital signals from logic NOR gates 402 having two inputs. This NOR gates 402 are input connected to the read enable second signals $REN_1$–$REN_{NR}$. The parallel inputs of the second register 400b are connected to a power supply $V_{DD}$, i.e. this register stores a logic 1 in each flip-flop in the chain.

An address sequencer ADDSEQ of the control block CI comprises the further first registers 400c to store the write/read enable signals $WEN_1$–$WEN_{NW}$ and $REN_1$–$REN_{NR}$. The serial outputs of the further first registers 400c are the first MS[0] and the second MS[1] selection mode signals that are indicative of the operation to be carried out via the ports of the memory device CORE (either read or write). Furthermore, the address sequencer ADDSEQ comprises the further second registers 400d to store the first addresses $W_1$–$W_{NW}$ and the second addresses $R_1$–$R_{NR}$. The serial outputs of the further second registers 400d are the first RAI and second RBI address buses to be sent to the memory device CORE. Furthermore, further serial outputs of registers 400d are the first MUX_A and the second MUX_B multiplexing digital signals to be sent to an output logic block OUTLOG. In addition, the address sequencer ADDSEO comprises the third register 400e (for example, including several registers that are analogous to the register from FIG. 4) to store the input data buses $D_1$–$D_{NW}$ to be provided to the device CORE via the intermediate input data serial bus DI.

Figure 5:
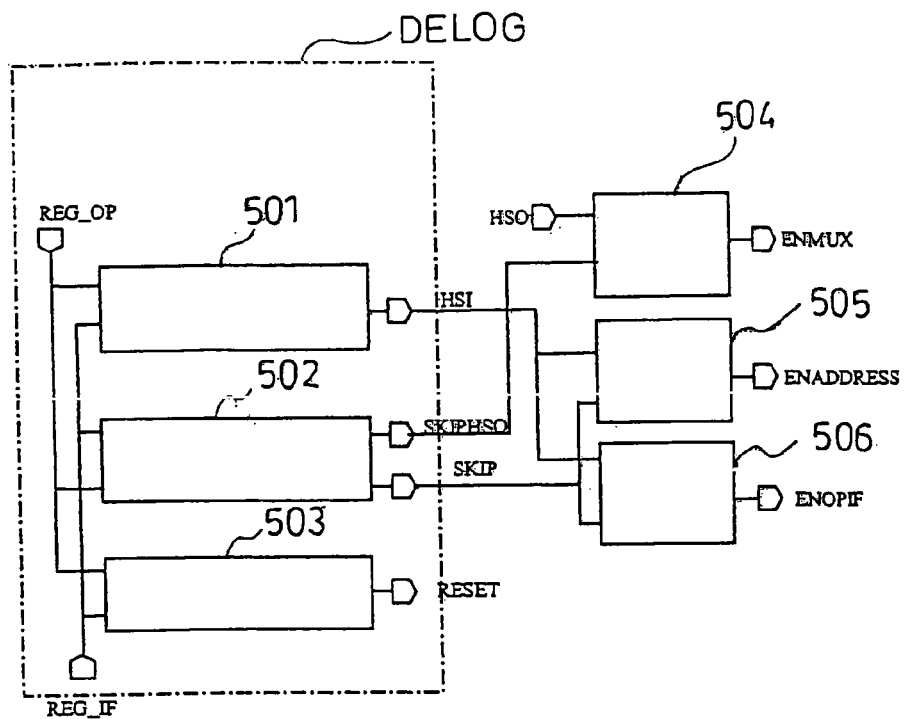
FIG. 5 is a schematic diagram illustrating a decision logic block associated with the control block of FIG. 3.

A preferred embodiment of the decision logic block DELOG from FIG. 3 is schematically illustrated in FIG. 5. Particularly, this decision block DELOG is a combinatory circuit and comprises first 501, second 502 and third 503 functional blocks that can be implemented via digital logic circuits. Furthermore, the first REG_IF and the second REG_OP status flags are the inputs of these functional blocks 501–503.

It should be observed that the first 501 and second 502 functional blocks can be selectively activated as a function of the logic values (0 or 1) that are taken by the flags REG_IF and REG_OP at a falling edge of the start signal FSMSTART. For example, as shown in FIG. 5, the first 501 and the second 502 functional blocks, when activated, are connected to further functional blocks 504–506 (i.e. further digital circuits) to supply the first handshake signal HSI, the first SKIP and the second SKIPHSO skip signals to them. The first skip signal SKIP contains skip information to allow shifting the addresses of the locations to be read or written in the event that one or more accesses to the memory device CORE are to be neglected.

The third functional block 503 is activated to supply the RESET signal. It should be observed that the further first functional block 504 operates to provide a multiplexing activation signal ENMUX at a positive rising edge of the second handshake signal HSO or of the second skip signal SKIPHSO. Similarly, the further second block 505 operates to provide an address enable signal ENADDRESS at a rising edge of the first handshake signal HSI or the first skip signal SKIP. This signal ENADDRESS is an enable signal of the registers 400c–e of the address sequencer ADDSEQ. Finally, the further third block 506 provides an operation enable signal ENOPIF at a falling edge of the first handshake signal HSI or the first skip signal SKIP. This signal ENOPIF is an enable signal of the registers 400a–b of the operation sequencer OPSEQ.

Figure 6:
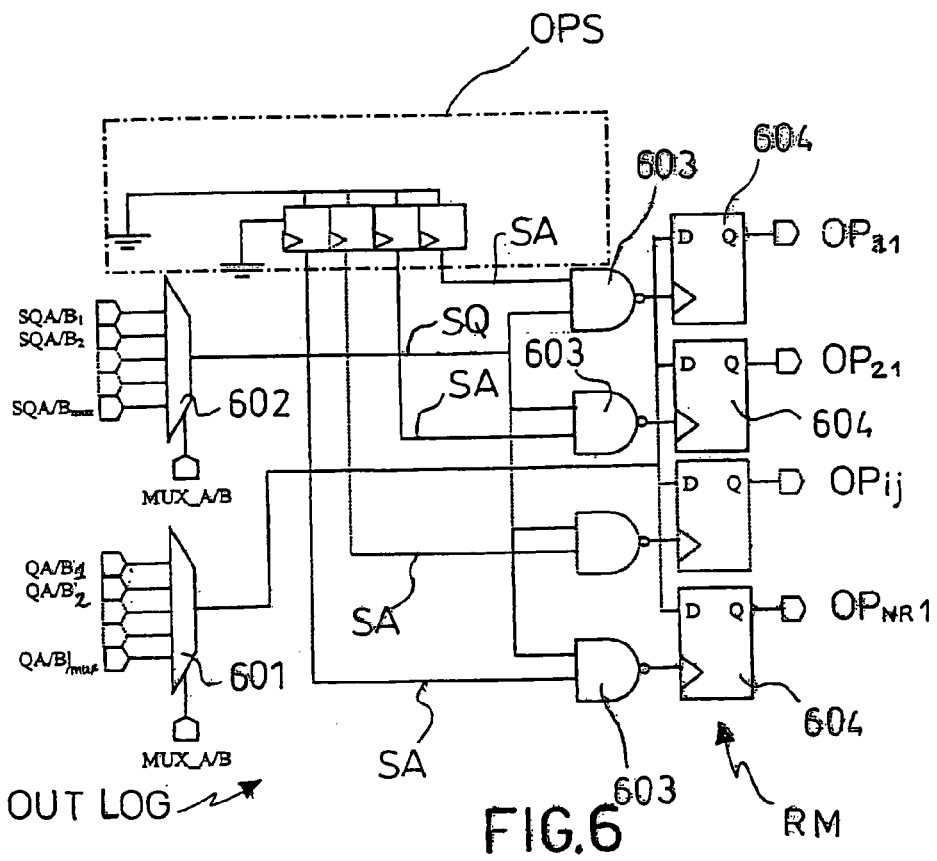
FIG. 6 is a schematic diagram illustrating a structure of an output logic block associated with the control block of FIG. 3.

Preferably the output logic block OUTLOG from FIG. 3 is included in the buffer block I/O BUF and can be implemented via a structure that is schematically illustrated in FIG. 6. According to the example in question, which provides a dual-port memory device CORE, the output block OUTLOG comprises first multiplexers that can be controlled through the multiplexing signals MUX_A and MUX_B to select one of the conductive lines (generally indicated with $QA/B_1$–$QA/B_{mux}$) of the intermediate data buses QA and QB, respectively. In FIG. 6, of these first multiplexers only one is shown that is indicated with the reference numeral 601, and to which a number of conductive lines $QA_1$–$QA_{mux}$ or a number of conductive lines $QB_1$–$QB_{mux}$ will have access.

Furthermore, the output block OUTLOG comprises second multiplexers that can be controlled through the same multiplexing signals MUX_A and MUX_B to select one among the conductive lines ($SQA/B_1$–$SQA/B_{mux}$) of the strobe signal buses SQA and SQB, respectively. In FIG. 6, only one of the second multiplexers is shown that is designated with the reference numeral 602, and to which a number of conductive lines $SQA_1$–$SQA_{mux}$ or a number of conductive lines $SQB_1$–$SQB_{mux}$ will have access. For clarity reasons, reference will be made only to the multiplexers shown in FIG. 6, as those skilled in the art will be able to extend the present description to the other multiplexers being provided in block OUTLOG.

For example, it may be desired that each output bus $OP_1$–$OP_{NR}$ carries Nb=8 bits starting from the M=128 bits being carried by each intermediate output data bus QA and QB. In this case, sixteen multiplexers 601 are provided, each one having sixteen input conductive lines. Among these sixteen multiplexers, a first group of eight multiplexers is connected to the conductive lines of the first intermediate output data bus QA and a second group of eight multiplexers is connected to the conductive lines of the second intermediate output data bus QB. The output of each of these sixteen multiplexers is a single conductive line.

Similar considerations are valid for the multiplexers being associated to the conductive lines of the strobe signal buses SQA and SQB. In the example in question, the conductive lines of the strobe signal buses SQA and SQB are one hundred and twenty-eight (as many as the conductive lines of QA and QB) and the multiplexers used are as many as those of QA and QB.

The output block OUTLOG further comprises register device or means RM that are intended to store all the data being provided to the first plurality of multiplexers 601 and outputting them back on the buses $OP_1$–$OP_{NR}$. These register means include a plurality of flip-flops (only some of which are illustrated in FIG. 6, with the reference numeral 604) each having an output line being an conductive line of the output buses $OP_1$–$OP_{NR}$. In FIG. 6, each flip-flop 604 is connected to a respective conductive line $OP_{11}$, $OP_{21}$, ..., $OPij$, ..., $OP_{NR1}$.

For example, by fixing NR=4 (two read elementary accesses to the memory device CORE), M=128 bit, Nb=8 bit with sixteen first multiplexers 601, thirty-two flip-flops 604 will be obtained. Each output bus $OP_1$–$OP_{NR}$ provides eight flip-flops 604. Each first multiplexer 601 is connected to four flip-flops 604 that can be selectively enabled/disabled to store the bit being provided by the specific multiplexer 601. Flip-flop 604 storage enabling/disabling is carried out via strobe signals SQ (resulting from the selection made by the second multiplexers 602) and activation signals SA (being supplied by an output port selector OPS) that are provided to second logic NAND gates 603.

In the schematic example of FIG. 6, the second multiplexer 602 is connected to second logic NAND gates 603 each having two inputs. Particularly, the conductive lines of the strobe signals SQA/SQB resulting from multiplexing are provided to one of the inputs of the NAND gates 603, whereas the other input of each gate is connected to an output port selector OPS. This selector OPS comprises a flip-flop shift register having the parallel inputs and the first serial input mass connected and this register being preloaded with a preset bit sequence, comprising all bits equal to a logic 1 and one single bit equal to a logic 0. The position of the logic 0 indicates which output flip-flop 604 is activated (through the corresponding NAND gate 603) to store the datum QA/QB from the multiplexer 601. The remaining output flip-flops 604 can be activated in succession as a consequence of the logic 0 shifting within the sequence in response to an enable pulse of selector OPS.

Figure 8:
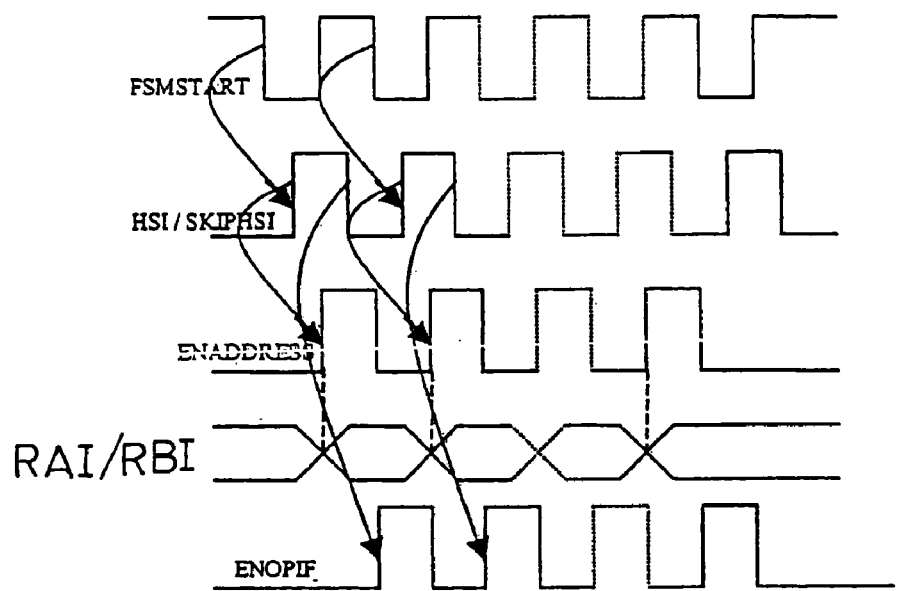
Figure 9:
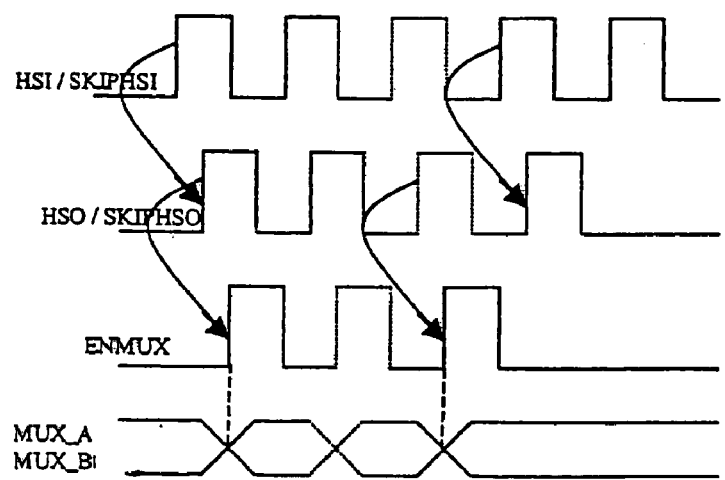

An example of operation of the memory 100 of the invention can be described with reference to the FIGS. 2–6 above and the time diagrams of FIGS. 7, 8 and 9 relative to the patterns of the signals being generated within the interface device IF and exchanged by the latter with the memory device CORE. Particularly, operation steps will be described relative to memory 100 reading and writing based on read/write elementary accesses to the memory device CORE.

At a positive edge of a pulse of the clock signal CK, the latch 201 (FIG. 2) deasserts the input storage signal S0P1, i.e. generates a falling edge of this signal, which is indicative that the elementary accesses have started. The signal S0P1 sent to the control block CI is maintained deasserted for the entire access cycle to the memory device CORE. All the input signals of the interface device IF, i.e. the write and read enable signals $WEN_1$–$WEN_{NW}$ and $REN_1$–$REN_{NR}$, the addresses $W_1$–$W_{NW}$ and $R_1$–$R_{NR}$ and the data $D_1$–$D_{NW}$ are stored in the registers 400a–e through the respective parallel inputs. Subsequently to this storage, the registers 400a–400e are ready to provide the respective outputs in a serial manner.

It should be observed that in each register 400a–400e the last flip-flop in the chain causes the first parallel input to pass to the serial output without the enable signal ENABLE being applied. Still at the rising edge of the clock CK, a first negative pulse of the start signal FSMSTART is generated through the first pulse generator 202 and NAND gate 205 (FIG. 2). Particularly, the falling edge of the start signal FSMSTART enables the decision logic DELOG.

At this time, the first REG_IF and the second REG_OP status flags on output from the first 400a and second 400b registers, respectively, are evaluated by the decision logic DELOG. If both flags REG_IF and REG_OP take a high logic value (logic 1) the control block CI will send a first positive pulse to the memory device CORE (FIG. 7) of the first handshake signal HSI (handshake in), i.e. an read or write elementary operation will be started. This read or write elementary operation of the memory device CORE is carried out in accordance with the current values being provided on the conductive lines RAI, RBI, MS[0], MS[1], DI.

At the rising edge of the pulse of the first handshake signal HSI, the further second functional block 505 (FIG. 5) generates a positive pulse of the address enable signal ENADDRESS that shifts the contents of the registers 400c–e to the serial outputs RAI, RBI, MS[0], MS[1], DI to provide the memory device CORE with the data and addresses relative to the subsequent elementary operation. Maximum set-up time is thereby ensured for each primary input of the memory device CORE. In order to execute the operation in a proper manner, the hold time of the inputs (RAI, RBI, MS[0], MS[1], DI) of the memory device CORE requires to be near zero.

At the falling edge of the same pulse of the handshake signal HSI, the further third functional block 506 generates a positive pulse of the operation enable signal ENOPIF that shifts the contents of the registers 400a–b of the operation sequencer OPSEQ to provide the flags REG_IF and REG_OP relative to the subsequent operation. Due to the fact that the flags REG_IF and REG_OP affect the generation of the first handshake signal HSI the choice of shifting the contents of the registers 400a–c at the falling edge of the signal HSI prevents race conditions.

Figure 7:
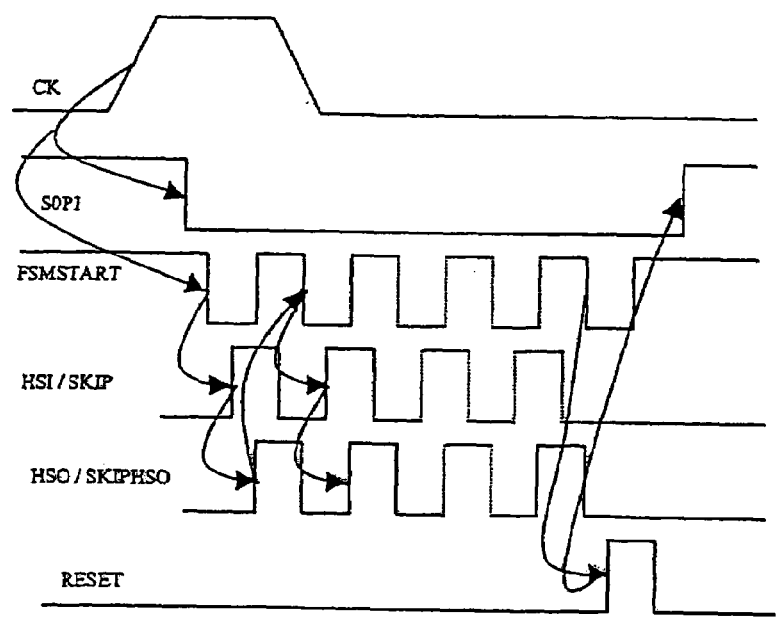
FIGS. 7, 8 and 9 are timing diagrams of signals used in the operation of the memory device and the interface device of the present invention.

Upon completion of the first elementary operation that is carried out on the memory device CORE, the latter generates a first positive pulse of the second handshake signal HSO to indicate that the read or write elementary operation is terminated (FIG. 7). This second handshake signal HSO generates, by means of the second pulse generator 203 and NAND gate 205, a second negative pulse of the start signal FSMSTART to start a second access to the device CORE through the control block CI.

Furthermore, at the rising edge of the second handshake signal HSO, the further first functional block 501 (FIG. 5) generates a positive pulse of the multiplexing enable signal ENMUX (FIG. 9) being supplied to the registers 400d relative to the multiplexing signals MUX_A and MUX_B such as to shift the contents thereof. Therefore, the multiplexing signals for the subsequent operation are provided to the output logic block OUTLOG. The maximum set-up time is thereby ensured for all the primary inputs of the output block OUTLOG.

In the case where a read elementary operation of the memory device CORE has been required, the output logic block OUTLOG is enabled at the rising edge of the strobe signals SQA/B. The multiplexing signals MUX_A/B suitably select, by means of the first multiplexers 601 and the second multiplexers 602, particular conductive lines of the intermediate data buses QA/B and the strobe signal buses SQA/B.

In accordance with the multiplexing signals MUX_A/B, the correct datum QA/B can be sampled and sent to the corresponding flip-flops 604 and then to the corresponding conductive lines of the output buses $OP_{ij}$. This is possible because the strobe signals SQA/B and the data QA/B are produced in a synchronous manner by the same memory device CORE. In this case, the maximum set-up/hold time is ensured for the output flip-flops 604. Furthermore, this maximum time is independent from the number of bits being required on the output buses $OP_1$–$OP_{NR}$, from the number of bits on the buses QA and QB of the memory device CORE and from the multiplexing factor (the number M divided by the number Nb).

The interface device IF of the invention also provides the possibility of inhibiting the processing of one or more elementary operations on the memory device CORE by skipping to the subsequent operation/s or the end of the operation cycle. Particularly, this happens when the first flag REG_IF is a logic 0, whereas the second flag REG_OP continues to be equal to a logic 1. In this case, at the pulse of signal FSMSTART relative to the operation that one does not desire to execute, in the interface device IF a positive pulse of the first skip signal SKIP (in replacement of the first handshake signal HSI) is generated. As is shown with reference to the FIGS. 7–9, this skip signal SKIP is analogous to the first handshake signal HSI.

Thereafter, the control block CI generates a positive pulse of the second skip signal SKIPHSO (in replacement of the handshake signal HSO) to indicate that the step of inhibiting the access to the device CORE is terminated. Particularly, this second skip signal SKIPHSO is sent to the third pulse generator 204 (FIG. 2) to generate a new start pulse of signal FSMSTART and to start the subsequent operation. At the pulse of signal FSMSTART that is generated starting from the last pulse of second handshake signal HSO, i.e. the pulse relative to the end of the last operation on the memory device CORE, the control block CI generates a reset pulse on the second input of the latch 201 that asserts the storage signal S0P1 thereby terminating the operation cycle.

The present invention has considerable advantages over the prior art. In fact, in the traditional multi-port memories, the control of the elementary (read and write) operations to be carried out on the memory device is conferred only to the interface device multiplexing the external synchronization signal (clock) to obtain a further internal clock signal of the synchronous type. To generate this further internal clock signal, an additional circuit is used, such as for example a DLL (delay locked loop) or a PLL (phase locked loop). This additional circuit is sensitive to the process parameters, occupies a lot of space in the chip, emulates the maximum cycle time of the memory device without distinguishing between read and write cycles and requires an initial wait time for the phase-lock to be carried out.

The maximum operating speed of the prior art memories is limited to the frequency field where the read/write operations on the memory device can be properly carried out, thereby avoiding undesired overrun conditions. In fact, if the memory device and the interface device do not exchange any information with each other and one desires to design the memory using memory devices having a varying number of lines (i.e. with a varying a number of words), the cycle time $T_{cycle}$ of the memory (i.e. the time interval after which one can have access to the memory from the outside) is estimated as $$T_{cycle}=N(T_{core}+\Delta T)=NT_{core}+N\Delta T \quad (1)$$

Where $T_{core}$ is a further cycle time of the memory device to which a first design margin $\Delta T$ is added to provide the use of a slower memory device. Furthermore, it should be observed that to compute the cycle time $T_{cycle}$ of the memory, the sum $T_{core}+\Delta T$ is to be multiplied by the N number of times one desires to access the memory device. In other words, the first margin $\Delta T$ is to be provided at each elementary access to the memory device.

In the memory 100 of the invention, the accesses to the memory device CORE are also managed by the latter via the asynchronous handshake mechanism, i.e. with the exchange of information with the interface device IF. Particularly, the interface device IF provides the CORE with the first handshake signal HSI and the addresses of the locations to be read/written, while it receives from the CORE the second handshake signal HSO when the read/write operations are terminated. This second signal HSO can be used by the interface device IF to provide the new addresses and a new first handshake signal HSI, or to skip one or more operations (through the signal SKIP), or to prepare the memory to the subsequent clock cycle if all the operations have been completed.

Advantageously, via the second handshake signal HSO, the memory design is not required to provide a design margin $\Delta T$ per each elementary access to the device CORE. In fact, it is sufficient to provide, within the external clock cycle, only one design margin to be set based on the maximum number of elementary accesses to the memory device CORE. In this way, even when memory devices CORE are used with a varying number of location lines, the cycle time $T_{cycle}$ of the inventive multi-port memory is minimized and the corresponding operating frequency F (dove $F=1/T_{cycle}$) is maximized.

Advantageously, in the multi-port memory 100 of the invention the additional circuits of the type DLL or PLL are not required to be introduced. Furthermore, with the prior art interfaces, the outputs from the memory devices (the data being read) are sampled by estimating an access time $T_{aa}$ to this device (i.e. after how much time from the access to the memory device the outputs to be sampled are made available). Particularly, said estimated access time $T_{aa}$ comprises a second time margin $\Delta T'$ to take into account acquisition delays by interface of the information on the availability of the datum to be sampled. These delays will increase upon increase in the number of bits composing the data stored within the memory device, i.e. upon increase in the horizontal dimension thereof. Therefore, the access time can be evaluated as $$T_{aa}=T_{aa}(Qi)+\Delta T' \quad (2)$$

Where $T_{aa}(Qi)$ is the access time for the $i^{th}$ intermediate output Qi.

In the memory 100 of the invention, the interface device IF can quickly and properly sample the intermediate output data QA and QB by having recourse to the strobe signals SQA and SQB from the same memory device CORE, i.e. by using another handshake mechanism. In fact, because the strobe signals SQA and SQB are locally generated to the cells of the device CORE, they are synchronous with the respective intermediate data QA and QB. In other words, these strobe signals SQA and SQB are additional information from the memory device CORE to indicate when these intermediate data to be sent to the output buses $OP_1$–$OP_{NR}$ of the memory are to be sampled. In this way, when designing the interface device IF, the second margin $\Delta T'$ is not required to be taken into account, because the device IF operates properly regardless of the number of bits of the memory device CORE.

Advantageously, via the strobe signals SQA and SQB, the access time $T_{dd}$ can be minimized. Advantageously, the multi-port memory 100 of the invention is configured such as to be adaptable upon variation of the number of lines and/or columns of the memory device CORE. Therefore, a "multi-port memory family" or "memory generators" can be created (by varying words and/or bits the number of ports remaining equal) though using the same interface device IF (with the same layout) which is adaptable per se and always ensures maximum performance (by minimizing the cycle and access times) due to the handshake mechanism.

Furthermore, by using a memory device CORE with a certain number of ports and an interface device IF like the one described above, a memory can be emulated with a greater number of ports by means of the handshake procedure without occupying a much larger chip area than that occupied by the memory device CORE. In addition, by the multiplexing of the lines of the intermediate data buses QA and QB that is carried out within the interface device IF, the number of the conductive lines of the output buses $OP_1$–$OP_{NR}$ can be considerably lower than the ones on output from the memory device CORE. Thereby, the complex signal routing required by the traditional multi-port memories, which reduces the robustness of the chip, is avoided.

Furthermore, it should be observed that within the interface device IF, the sequential circuit blocks (registers 400a–e) and the combinatory circuit blocks (DELOG) preferably are structurally separated, i.e. they are integrating made on distinct areas being electrically connectable. The choice of employing a structural separation of the sequential from the combinatory blocks is advantageous compared with the choice of making the interface device IF via a state machine where several combinatory parts are interleaved by means of sequential parts. In fact, this structural separation allows a modularity of the interface device and an easier reconfigurability of the same to be adapted to various design requirements. To this purpose, the number of ports externally emulated by the memory 100 can be simply modified by decreasing or increasing the number of flip-flops of the sequential registers 400a–e.

For the semi-conductor memory of the present invention, those skilled in the art, aiming at satisfying contingent and specific requirements, will be able to carry out further modifications and variants, all being however contemplated within the scope of protection of the invention, such as defined by the following claims.

Figure 10A:
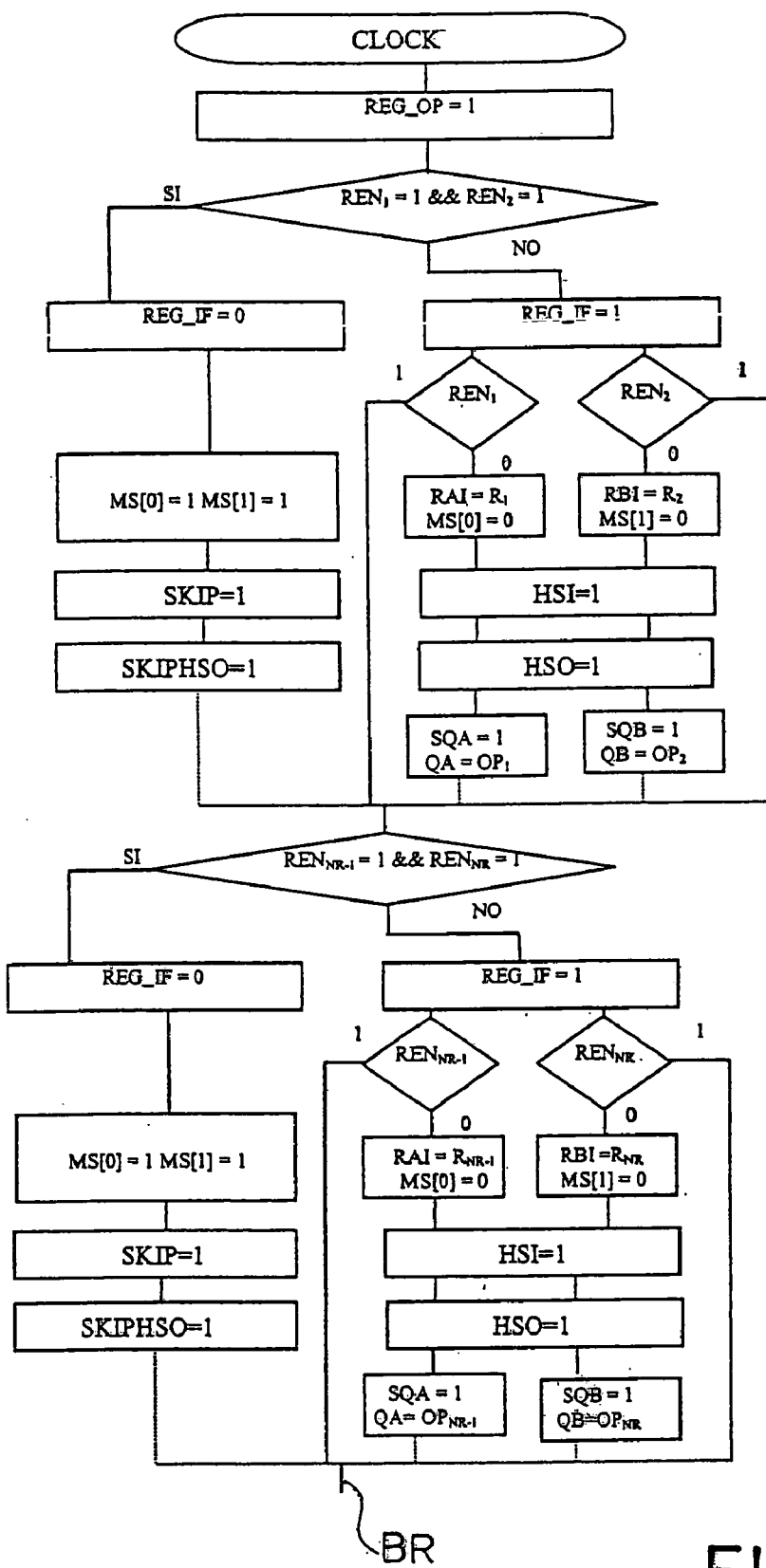
FIGS. 10A and 10B are a flow chart of an interaction process in accordance with the invention.
Figure 10B:
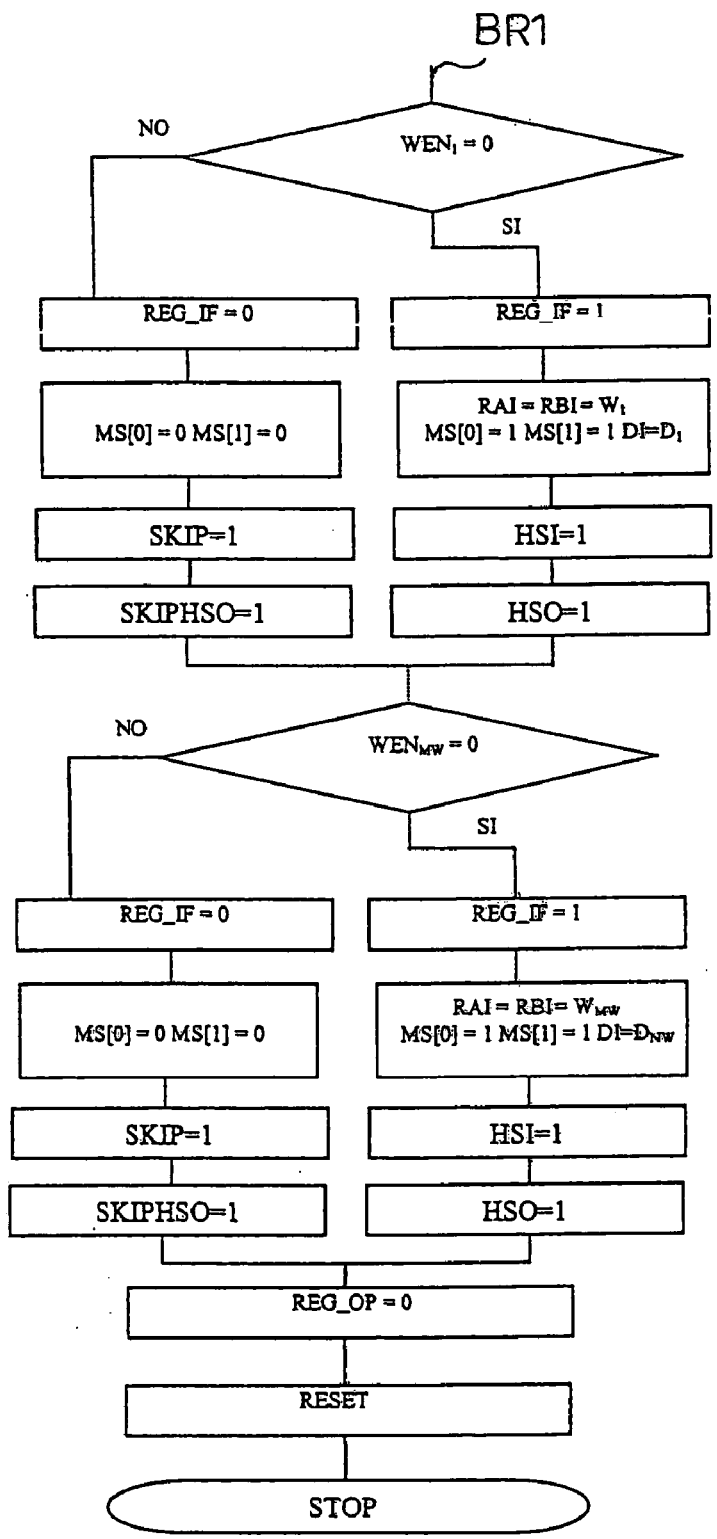

For completeness, the FIGS. 10A–B show in the form of a flow chart an exemplary management process or algorithm for the interaction of the memory device CORE to the interface device IF in accordance with the handshake method provided above.

The process provides the following steps:
1. at the rising edge of the clock CK there are stored all the inputs. The status flag REG_OP (that stores whether the current operation is the last one)==1
2. until REG_OP==0:
   a. is i=1
   b. while i<=$N_R$:
      i. The interface:
         1. stores $R_i$ addresses on the bus RAI of the CORE
         2. stores $R_{i+1}$ addresses on the bus RBI of the CORE
      ii. if $REN_i$=$REN_{i+1}$==1 then REG_IF=0. In this case, no operation is carried out. The interface sets i=i+2 and then:
         1. if i>NR+NW sets REG_OP==0 and step 3 starts
         2. else, step 2.b starts again
      iii. else REG_IF ==1(at least one read elementary operation is to be executed)
         1. if $REN_i$==0 a read operation from port RAI is started. The interface turns MS[0]=0 (Mode Select) thereby providing the CORE with information that a read operation from the port RAI has been started
         2. else if $REN_i$==1 a skip reading from port RAI is started. The interface turns MS[0]=1 (Mode Select) thereby providing the CORE with information of not to start a read operation from port RAI
         3. if $REN_{i+1}$==0 a read operation from port RBI is started. The interface turns MS[1]=0 (Mode Select) thereby providing the CORE with information of starting a read operation from the port RBI
         4. else if $REN_{i+1}$==1, a skip reading from the port RBI is started. The interface turns MS[0]=1 (Mode Select) thereby providing the CORE with information of not starting a read operation from port RBI
      iv. the interface generates the handshake signal HSI starting the operation of the CORE
      v. in case of asymmetric bit output ports (with respect to the write ports) multiplexing signals are sent to the output stages for both read elementary ports
      vi. the interface waits for the synchronization signals SQA to know when the multiplexed bus QA is to be sampled and then send it to the output port OPi. It waits for the synchronization signals SQB to know when the multiplexed bus QB is to be sampled and send it to the output port $OP_{i+1}$
      vii. the interface waits for the handshake signal HSO from the CORE to set i=i+2, then:
         1. if i>NR+NW sets REG_OP==0 and start step 3
         2. else step 2.b starts again
   c. is j=1
   d. while j<=NW:
      i. The interface:
         1. stores $W_j$ addresses on the bus RAI of the CORE
         2. stores Wj addresses on the bus RBI of the CORE
      ii. if $WEN_j$==1 then REG_IF=0. In this case, no operation is executed. The interface sets j=j+2, then:
         1. if j>NW sets REG_OP==0 and step 3 is started
         2. else, step 2.d starts again
      iii. else REG_IF=1 (a write elementary operation has to be started)
         1. if $WEN_j$==0 a write operation starts. The interface turns MS[0]=1 and MS[1]=1 (Mode Select) thereby providing the CORE with information to start a new write operation from the port RAI and RBI
         2. else, if $WEN_j$==1 a skip writing starts. The interface turns MS[0]=0 and MS[1]=0 (Mode Select) thereby providing the core with information of not starting a write operation from port RAI and RBI
      iv. the interface generates a handshake signal HSI starting the operation of the CORE
      v. the interface waits for the handshake signal HSO from the CORE to set j=j+2, then:
         1. if j>NW sets REG_OP==0 and step 3 is started
         2. else step 2.d starts again
12. 3. a new clock cycle can be started.

That which is claimed is:
1. A semiconductor memory comprising:
a memory device to store digital data and including a plurality of intermediate outputs including a first intermediate output comprising a first plurality of output lines for the data, the memory device generating strobe signals each being indicative of the presence of data on at least one intermediate output;
a register circuit being selectively connectable to the first intermediate output to store data of the memory device and including a plurality of second outputs including first and second register outputs each comprising a respective second plurality of output lines for the data; and
an interface device to receive strobe signals from the memory device and command the register circuit to provide on the first and second outputs the data stored in the register circuit by emulating a multi-port memory with the number of second outputs being greater than the number of intermediate outputs.

2. The memory in accordance with claim 1, wherein the second plurality of output lines includes less output lines than the number of output lines of the first plurality of output lines, each output line of the first and second plurality corresponding to an information bit.

3. The memory in accordance with claim 2, wherein the register circuit comprises a plurality of flip-flops each for storing an information bit and each being connected to a respective output line of the second plurality.

4. The memory in accordance with claim 1, further comprising a control block to receive in parallel a plurality of address signals comprising first addresses of locations to be read/written in the memory device and second addresses being representative of output lines of the second plurality to which data corresponding to the read locations are to be supplied.

5. The memory in accordance with claim 4, wherein the control block comprises a first sequential circuit to receive in parallel the address signals and output a first group of serial signals corresponding to the first addresses and a second group of serial signals corresponding to the second addresses.

6. The memory in accordance with claims 5, wherein the second plurality of output lines includes less output lines than the number of output lines of the first plurality of output lines, each output line of the first and second plurality corresponding to an information bit; wherein the register circuit comprises a plurality of flip-flops each being intended to store an information bit and each being connected to a respective output line of the second plurality; and wherein the interface device comprises at least a first multiplexing circuit to select an output line of the first plurality and send the corresponding information bit to the register circuit and allow the storage thereof based on the second group of signals.

7. The memory in accordance with claims 6, wherein the memory device comprises a plurality of third output lines for the strobe signals each being indicative of the presence of an information bit on the respective output line of the first plurality.

8. The memory in accordance with claim 7, wherein the interface device comprises at least a second multiplexing circuit to select an output line of the third plurality based on the second group of signals and enable the flip-flop corresponding to the output of the respective stored bit.

9. The memory in accordance with claim 5, wherein the first sequential circuit comprises a first flip-flop register module to execute a parallel/serial conversion.

10. The memory in accordance with claim 5, wherein the interface device comprises a second sequential circuit to receive data in parallel from the plurality of external inputs and serially provide corresponding data on at least one intermediate input.

11. The memory in accordance with claim 10, further comprising:
a plurality of enable lines connected to the interface device for read/write enable signals; and
at least one line to select a read/write mode to enable/disable the reading/writing of the memory device.

12. The memory in accordance with claim 11, wherein the interface device comprises a third sequential circuit to parallel store the read/write enable signals and provide them serially on the at least one line for selecting the reading/writing mode.

13. The memory in accordance with claim 12, wherein the interface device includes a decision logic block to generate, based on the read/write enable signals, an address enable signal to reconfigure the first, second and third sequential circuits to prepare them for a subsequent elementary read/write operation.

14. The memory in accordance with claim 11, wherein said interface device comprises:
an output for a first handshake signal to be sent to the memory device to indicate a beginning of an elementary read/write operation on the memory device; and
an input for a second handshake signal being received from the memory device to indicate an end of the elementary read/write operation on the memory device;
the first handshake signal being generated based upon the read/write enable signals.

15. The memory in accordance with claim 1, further comprising:

a plurality of external inputs being connected to the interface device to supply data to be written in the memory, each external input comprising a first plurality of input lines; and
at least one intermediate input in the memory device and comprising a second plurality of input lines to receive the data from the interface device, the number of external inputs being greater than the number of intermediate inputs.

16. The memory in accordance with claim 1, wherein the interface device read/write accesses the memory device at a first frequency that is greater than a second frequency of an external clock signal of the memory.

17. The memory in accordance with claim 1, wherein said interface device comprises:
an output for a first handshake signal to be sent to the memory device to indicate a beginning of an elementary read/write operation on the memory device; and
an input for a second handshake signal being received from the memory device to indicate an end of the elementary read/write operation on the memory device.

18. The memory in accordance with claim 17, wherein the second handshake signal is sent to the interface device to minimize a cycle time of the memory.

19. The memory in accordance with claim 1, wherein the strobe signals are sent by the memory device to the interface device to minimize an access time to the memory device.

20. A semiconductor device comprising:
a memory device to store digital data and including a plurality of intermediate outputs including a first intermediate output comprising a first plurality of output lines for the data, the memory device generating strobe signals each being indicative of the presence of data on at least one intermediate output;
a register circuit connectable to the first intermediate output to store data and including a plurality of second outputs including first and second register outputs each comprising a respective second plurality of output lines for the data; and
an interface device to receive the strobe signals and command the register circuit to provide the stored data on the first and second outputs.

21. The device in accordance with claim 20, wherein the second plurality of output lines includes less output lines than the number of output lines of the first plurality of output lines, each output line of the first and second plurality corresponding to an information bit.

22. The device in accordance with claim 21, wherein the register circuit comprises a plurality of flip-flops each for storing an information bit and each being connected to a respective output line of the second plurality.

23. A method of reading/writing data comprising:
storing digital data in a memory device including a plurality of intermediate outputs including a first intermediate output comprising a first plurality of output lines for the data;
generating strobe signals each being indicative of the presence of data on at least one intermediate output;
selectively connecting a register circuit to the first intermediate output to store data and including a plurality of second outputs including first and second register outputs each comprising a respective second plurality of output lines for the data; and command the register circuit, based upon the strobe signals, to provide the stored data on the first and second outputs.

24. The method in accordance with claim 23, wherein the second plurality of output lines includes less output lines than the number of output lines of the first plurality of output lines, each output line of the first and second plurality corresponding to an information bit.

25. The method in accordance with claim 24, wherein the register circuit comprises a plurality of flip-flops each for storing an information bit and each being connected to a respective output line of the second plurality.

* * * * *

UNITED STATES PATENT AND TRADEMARK OFFICE
CERTIFICATE OF CORRECTION

PATENT NO. : 7,190,631 B2
APPLICATION NO. : 11/228686
DATED : March 13, 2007
INVENTOR(S) : Blasi et al.

It is certified that error appears in the above-identified patent and that said Letters Patent is hereby corrected as shown below:

| | |
|---|---|
| Column 1, Line 36 | Delete: "various information"<br>Insert: --various information bits-- |
| Column 1, Line 49 | Delete: "much"<br>Insert: --many-- |
| Column 5, Line 47 | Delete: "sent"<br>Insert: --send-- |
| Column 6, Line 48 | Delete: "input"<br>Insert: --inputs-- |
| Column 6, Line 63 | Delete: "This"<br>Insert: --These-- |
| Column 7, Line 16 | Delete: "ADDSEO"<br>Insert: --ADDSEQ-- |
| Column 8, Line 36 | Delete: "device"<br>Insert: --devices-- |
| Column 8, Line 41 | Delete: "an conductive"<br>Insert: --a conductive-- |
| Column 9, Line 43 | Delete: "an read"<br>Insert: --a read-- |
| Column 9, Line 59 | Delete: "requires"<br>Insert: --is required-- |
| Column 12, Line 34 | Delete: "$T_{dd}$"<br>Insert: --$T_{aa}$-- |
| Column 12, Line 61 | Delete: "integrating"<br>Insert: --integrally-- |
| Column 13, Line 2 | Delete: "reconfiqurability"<br>Insert: --reconfigurability-- |
| Column 14, Line 30 | Delete: "12. 3."<br>Insert: --3.-- |

UNITED STATES PATENT AND TRADEMARK OFFICE
CERTIFICATE OF CORRECTION

PATENT NO. : 7,190,631 B2
APPLICATION NO. : 11/228686
DATED : March 13, 2007
INVENTOR(S) : Blasi et al.

It is certified that error appears in the above-identified patent and that said Letters Patent is hereby corrected as shown below:

Column 15, Line 7    Delete: "claims"
                     Insert: --claim--

Column 15, Line 20   Delete: "claims"
                     Insert: --claim--

Column 17, Line 1    Delete: "command"
                     Insert: --commanding--

Signed and Sealed this

Fourteenth Day of August, 2007

JON W. DUDAS
*Director of the United States Patent and Trademark Office*